US006285268B1

(12) United States Patent
Lodi

(10) Patent No.: US 6,285,268 B1
(45) Date of Patent: Sep. 4, 2001

(54) COUPLING NETWORK AND METHOD FOR WIDENING THE VARACTOR DIODE TUNING BAND OF MICROSTRIP DIELECTRIC RESONATORS

(75) Inventor: Umberto Lodi, Merate (IT)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/348,006

(22) Filed: Jul. 6, 1999

(30) Foreign Application Priority Data

Jul. 9, 1998 (IT) .............................................. MI98A1562

(51) Int. Cl.[7] ................................ H01P 7/00; H01P 7/10; H03B 7/06

(52) U.S. Cl. ................ 333/235; 333/219.1; 331/107 DD

(58) Field of Search ..................................... 333/235, 205, 333/219.1; 331/107 DD, 107 SL, 117 D; 329/354, 322

(56) References Cited

U.S. PATENT DOCUMENTS 4,835,498 * 5/1989 Rouger et al. ....................... 333/205
5,457,431 10/1995 Fuentes et al. ...................... 333/205

OTHER PUBLICATIONS

Patent Abstracts of Japan, vol. 13, No. 503 (E–844), Nov. 13, 1989 corresponding to JP 01 200814 A (Nippon Telegr & Teleph Corp) Aug. 14, 1989.

* cited by examiner

*Primary Examiner*—Robert Pascal
*Assistant Examiner*—Kimberly E. Glenn
(74) *Attorney, Agent, or Firm*—Sughrue, Mion, Zinn, Macpeak & Seas, PLLC

(57) ABSTRACT

A coupling network and a method are described for widening the varactor diode tuning band of microstrip dielectric resonators, for instance in microwave oscillators or in filtering arrangements. The present invention substantially provides for modifying the single-line asymmetric structure of a conventional network still utilizing a single varactor diode mounted on the plane of the microstrip circuit. In other words, the transmission line is duplicated thus creating a dipole structure which assures a tighter coupling with the dielectric resonator. Thanks to the duplication of the transmission line and to the fact that the center of the dipole is the location where currents are higher, it is possible to obtain far wider tuning bands as compared with a known and conventional configuration.

22 Claims, 4 Drawing Sheets

COUPLING NETWORK AND METHOD FOR WIDENING THE VARACTOR DIODE TUNING BAND OF MICROSTRIP DIELECTRIC RESONATORS

BACKGROUND OF THE INVENTION

1. Field of Invention

The present invention relates to microwave circuits provided with dielectric resonators whose resonance frequency must be electronically controlled and in particular relates to a coupling network and a method for widening the varactor diode tuning band of microstrip-coupled dielectric resonators.

2. Background Information

There are microwave circuits provided with dielectric resonators (or simply DR) whose resonance frequency must be electronically controlled by means of varactor diodes, which could be required to feature a tuning band extending beyond the very narrow limits usually obtainable with conventional networks. This is the case of, e.g., microwave oscillators or filtering arrangements using microstrip-coupled dielectric resonators which need electrical tuning, or similar devices.

A conventional coupling network between a dielectric resonator and a varactor diode, both placed on the same face of a microstrip circuit, includes a length of transmission line which is terminated at one side only, by means of the varactor diode and near to which the resonator is fixed. The control voltage is applied to the varactor diode through a suitable RF decoupling network. The transmission line and varactor diode assembly is dimensioned in such a way as to resonate at about the nominal frequency of the dielectric resonator. During the circuit operation, the magnetic field lines of the resonator interlink with the transmission line. By varying the bias voltage of the varactor diode, the capacitance of the latter is modified and the change of the resonance frequency of the dielectric resonator is thus determined. Unfortunately the tuning band obtainable in the manner described above is very narrow and generally it does not exceed 0.1%–0.2% of the resonator nominal frequency.

Another known method of widening the relative band up to 0.5%–1.0% consists in applying a ferrite element on the dielectric resonator, which modifies the distribution of the magnetic field lines, to be tuned by means of an external magnetic field generated by an external current-carrying winding. Such a solution however is impractical and has several drawbacks, among which: i) implying an increase of size (because of the overall dimensions of the electromagnet structure); ii) a remarkable sensivity to external magnetic fields and the consequent need for magnetic shields; iii) microfonics; iv) high consumption due to the electromagnet bias current; and v) a significant slowness of response due to current driving (as it happens for YIG oscillators).

SUMMARY OF THE INVENTION

In view of the prior art drawbacks pointed out above, the main object of the present invention is the therefore to provide a simple and economical coupling network for raising the coupling between varactor diode and resonator.

The aforesaid object is brilliantly achieved by a microstrip coupling network according to the independent claim 1 and a method according to the independent claim 7. The invention further provides a microwave oscillator or a filter comprising a coupling network according to any of claims 1 to 6.

Further advantageous features of the invention are set forth in the dependent claims.

A detailed description of the invention is now given solely by way of exemplifying and non-limiting example, which description should be read in conjunction with the attached drawings.

BRIEF DESCRIPTION OF THE DRAWINGS

In the drawings.

Obviously like reference numerals have been used to designate like parts or functionally equivalent parts throughout the various figures.

DETAILED DESCRIPTION OF THE PREFERRED EMBODIMENTS

Figure 1:
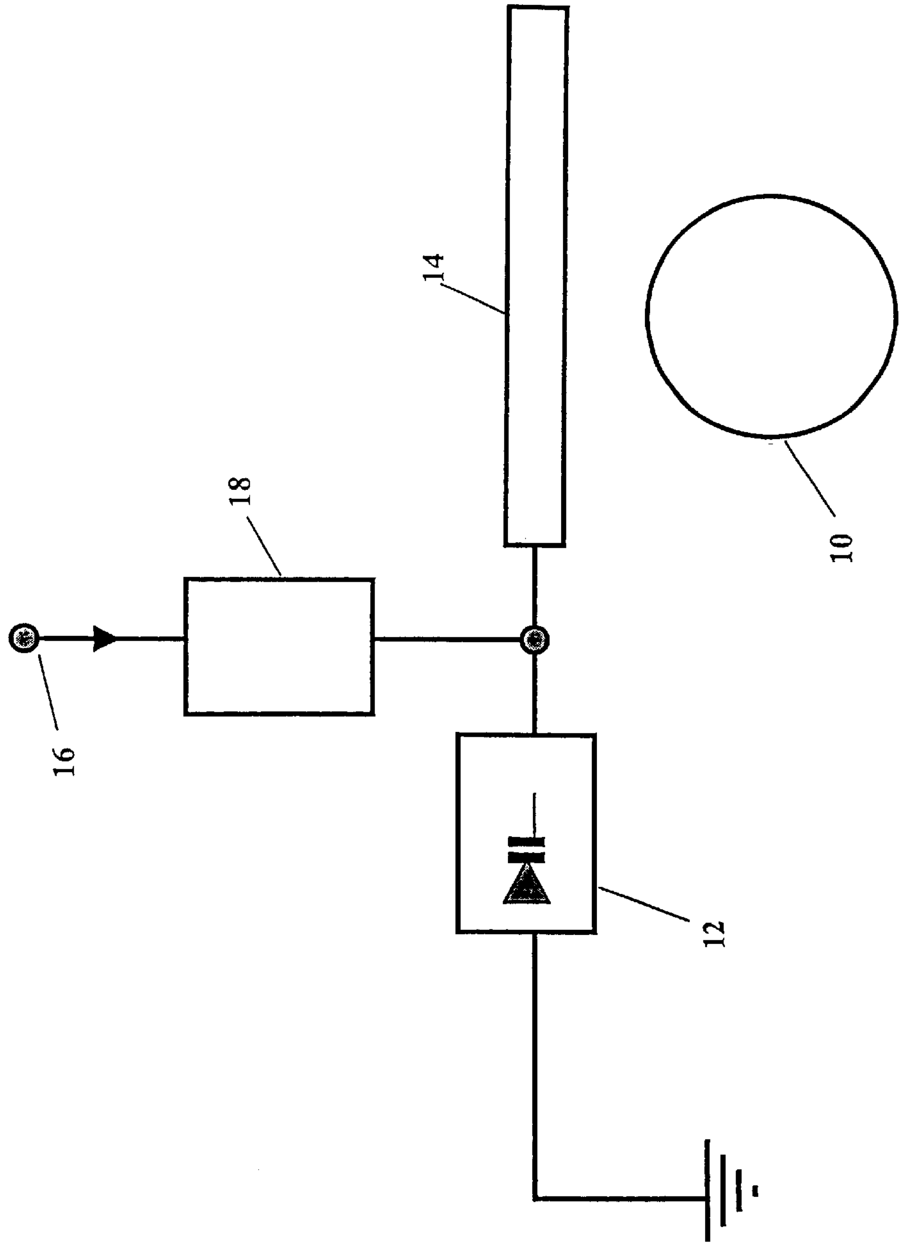
Fig. 1 PRIOR ART
FIG. 1 shows a schematic representation of a conventional coupling network between a dielectric resonator and a tuning varactor.
Figure 2:
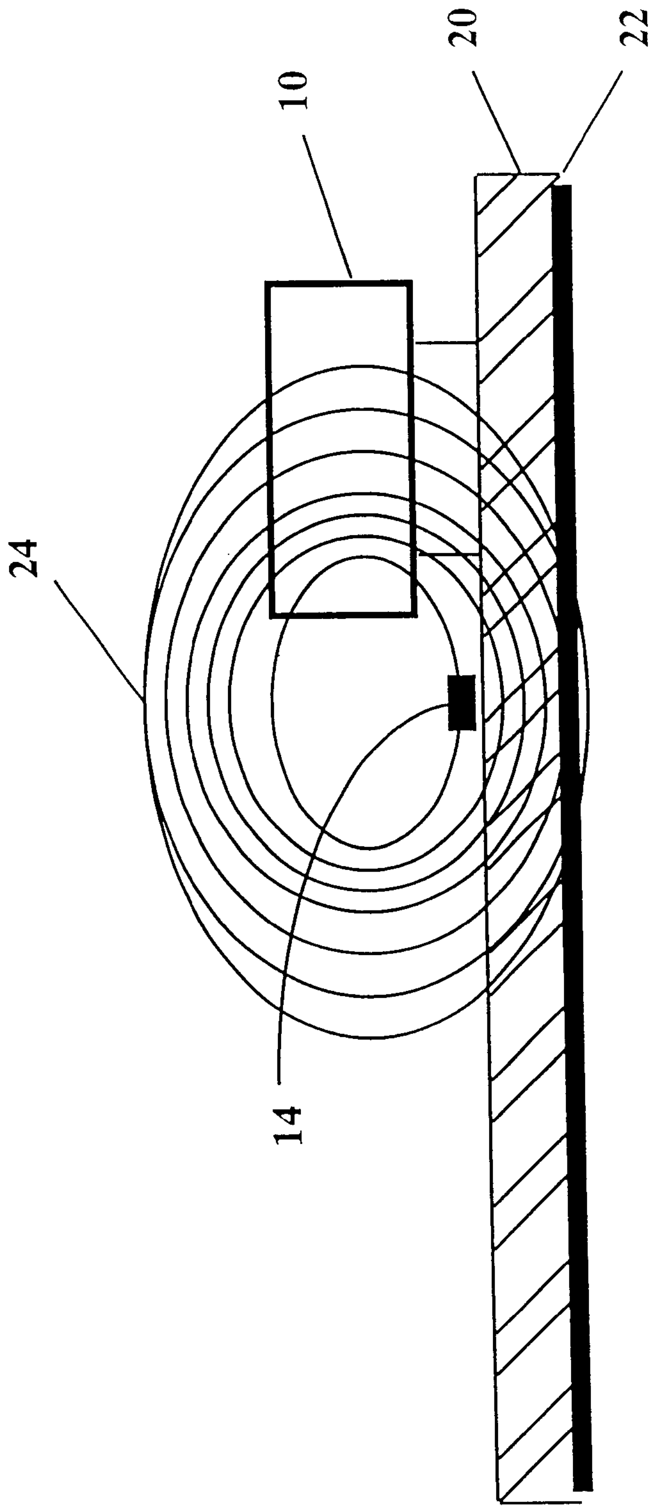
FIG. 2 shows the magnetic coupling between the dielectric resonator and a microstrip transmission line.

FIG. 1 shows a known coupling network between a dielectric resonator 10 and a varactor diode 12, both placed on the same face of a microstrip circuit located on a substrate 20 with ground plane 22 (FIG. 2). A length of transmission line 14 is terminated only at one end by means of the varactor diode 12, and the resonator 10 is fixed near to this line 14. The control voltage 16 is applied to varactor 12 through a suitable RF decoupling network 18. The varactor diode 12 and transmission line 14 assembly is so dimensioned as to resonate at about the nominal frequency of the dielectric resonator.

During the circuit operation, the magnetic field lines 24 of the resonator 10 link the transmission line as shown in FIG. 2. By varying the bias voltage of the varactor diode 12, the capacitance of the latter is modified and the change of the resonance frequency of the dielectric resonator 10 is thus determined. Unfortunately, as above mentioned, the big limitation of a configuration like the above one, is the reduced tuning band that can be obtained.

Figure 3:
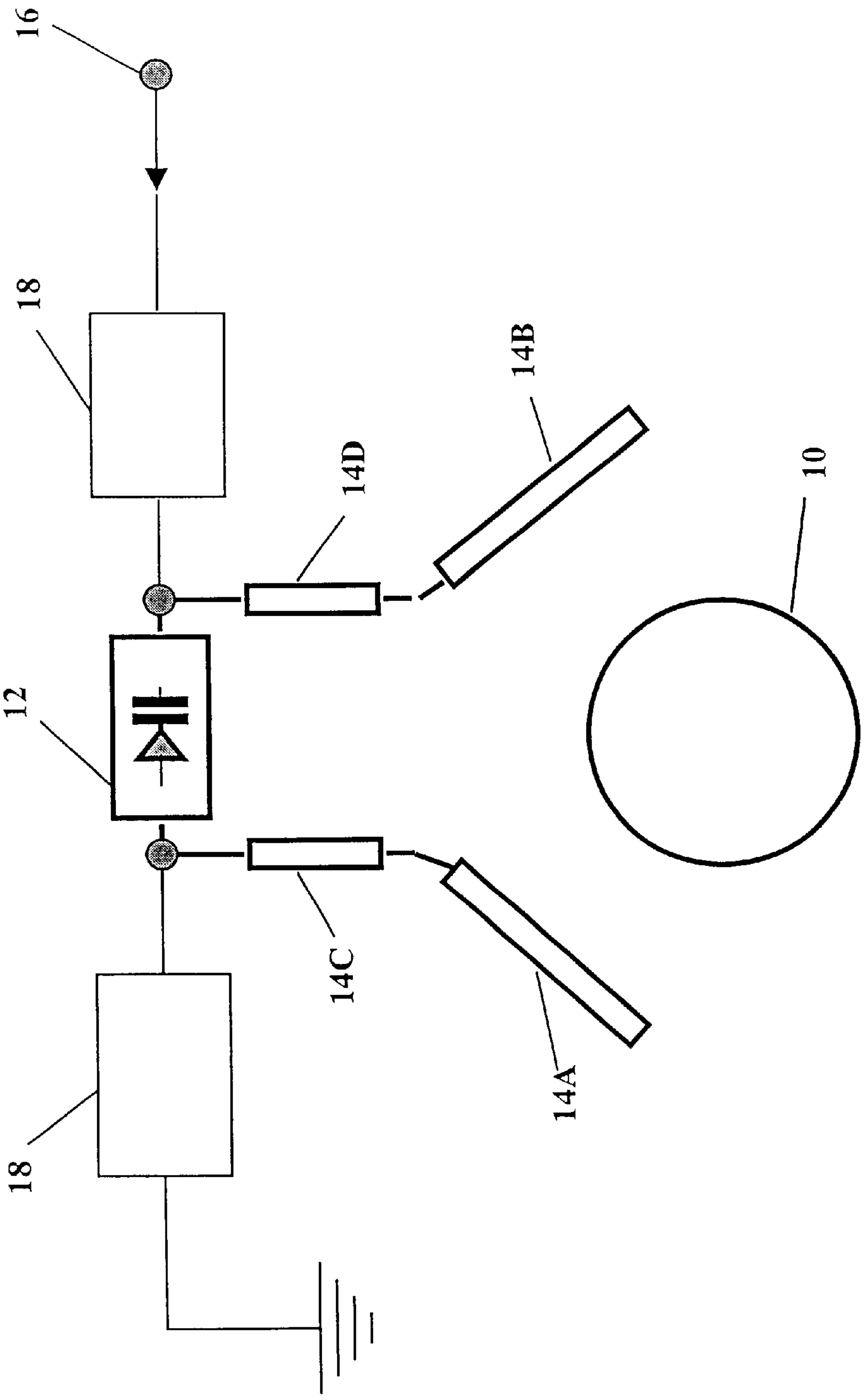
FIG. 3 diagrammatically illustrates the coupling network between dielectric resonator and tuning varactor in accordance with the present invention.

The microstrip coupling network according to a preferred embodiment of the present invention is illustrated in FIG. 3. It still provides a single varactor diode 12 mounted on the plane of the microstrip circuit. Moreover, the transmission line is duplicated by creating a dipole structure, which assures a tighter coupling with the dielectric resonator and therefore a widening of the tuning band. The single-line asymmetric structure 14 of FIG. 1 is changed into a (symmetric) balanced network, still on microstrip, realizing a dipole about half-wave long, which is positioned around the dielectric resonator: the two branches of the dipole are designated by 14A and 14B.

The varactor diode 12 is placed at the center of the dipole, connected to the two branches 14A and 14B via two short lengths 14C and 14D of line, about one-eighth wavelength long at the nominal operating frequency and is biased through suitable RF decoupling networks 18. Each of the two main lines 14A and 14B is about one-quarter wavelength long, still at the nominal operating frequency and having taken the capacitive loading effect of the varactor diode 12 into account.

Figure 4:
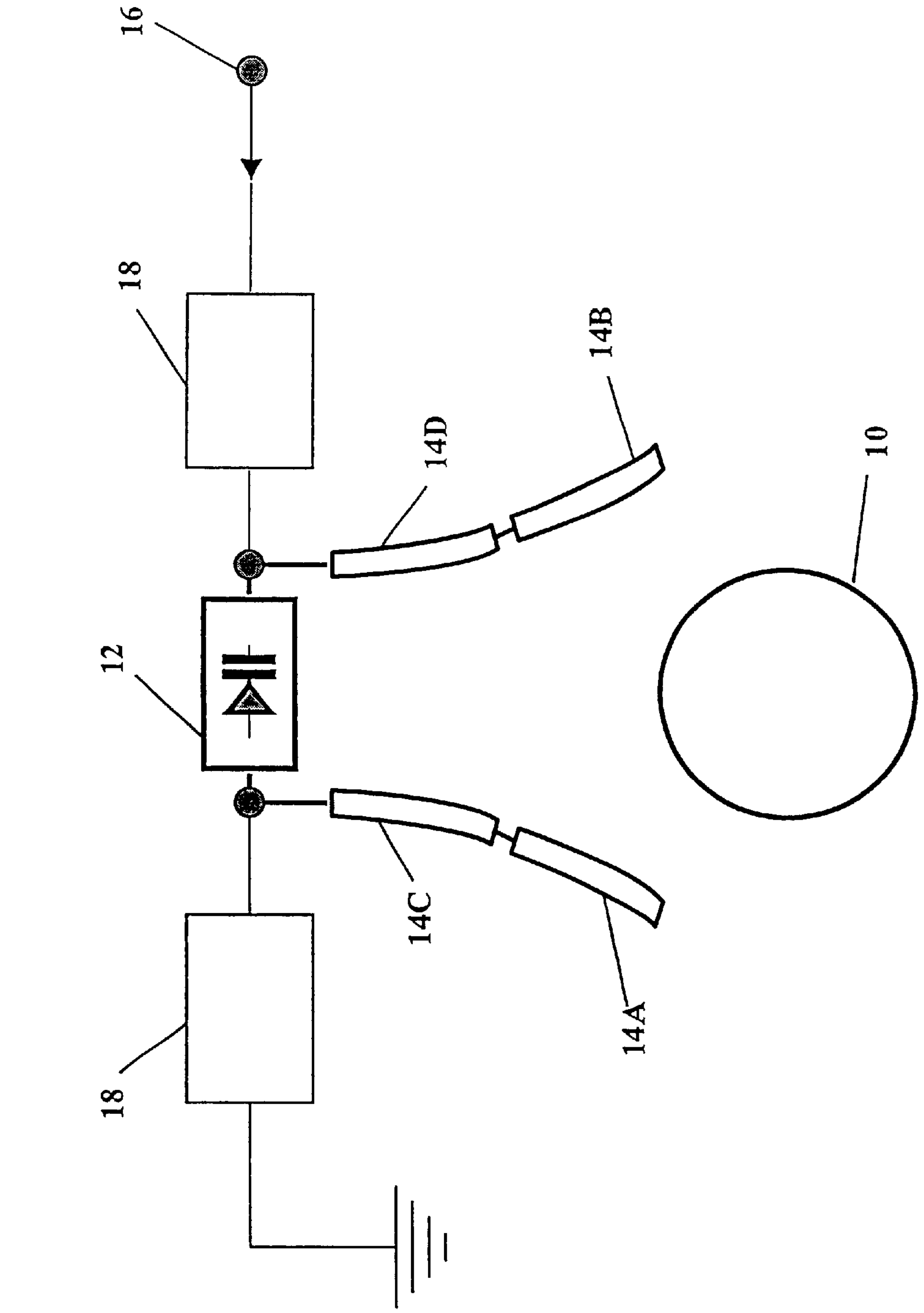
FIG. 4 diagrammatically illustrates the coupling network between dielectric resonator and tuning varactor, having curvilinear branches, in accordance with the present invention.

In order to obtain the maximum coupling, the dipole could be partially bent around the dielectric resonator 10. In other words, the two branches 14A and 14B can be rectilinear, as shown in FIG. 3, or they could have a rounded shape as shown in FIG. 4, which better follows the perimeter of the resonator 10. Naturally, other combinations could be envisaged, like e.g. two or more rectilinear lengths 14A and 14B shorter than those illustrated in FIG. 3, two or more curvilinear lengths as shown in FIG. 4, or also a combination of one or more rectilinear lengths with one or more curvilinear lengths.

Thanks to the duplication of the transmission line 14 and to the fact that the center of the dipole, which is at the closest point to the dielectric resonator, is the location where currents are higher, it is possible to obtain tuning bands far wider than the known solution, all substantially without any increase of cost.

Experimental results of tests carried out on 18 GHz oscillators are given by way of example wherein it has been found that it is possible to obtain, with the network according to the invention, relative bands about 0.45% wider.

Lastly, it is stressed that the above coupling network and method can be used not only in microwave oscillators but also in other devices like, e.g., filtering arrangements, which make use of microstrip dielectric resonators and which need electrical tuning.

It is obvious that several modifications, adaptations, variants and replacements of parts with other functionally equivalent components, to the embodiments illustrated and described in detail above can be made without departing from the scope defined by the following claims.

I claim:

1. A microstrip coupling network for electrically widening a tuning band of a dielectric resonator, comprising:

a varactor diode; and a transmission line that includes a dipole structure comprising two branches coupled to separate terminals of said varactor diode and provides a tighter coupling with said dielectric resonator.

2. A microstrip coupling network according to claim 1, wherein said dielectric resonator is substantially placed at the same distance from the two branches of said dipole structure.

3. A microstrip coupling network according to claim 1, wherein said dipole structure is about one-half wavelength long.

4. A microstrip coupling network according to claim 1, wherein said varactor diode is placed at the center of the dipole structure and is connected to its two branches through two further line lengths.

5. A microstrip coupling network according to claim 4, wherein said two branches and said two further line lengths are, respectively, one-quarter and one-eighth wavelength long at the nominal operating frequency.

6. A microstrip coupling network according claim 1, wherein each of the branches of said dipole structure comprises at least one bent length which substantially follows the shape of said dielectric resonator.

7. A method for widening the tuning band of a dielectric resonator through a microstrip coupling network, said network comprising a varactor diode and a transmission line, wherein the method comprises the step of duplicating said transmission line for creating a dipole structure having two branches coupled to separate terminals of said varactor diode in series, and providing a tighter coupling with said dielectric resonator.

8. A method according to claim 7, wherein it comprises the further step of positioning said dielectric resonator substantially at the same distance from the two branches.

9. A method according to claim 7, wherein it comprises the further step of providing for each of said branches comprises at least one bent length that substantially follows the shape of said dielectric resonator.

10. A method according to claim 7, wherein it comprises the further step of biasing said varactor diode through suitable radiofrequency decoupling networks.

11. A microwave oscillator comprising a coupling network according to claim 1.

12. A filter comprising a coupling network according to claim 1.

13. A microstrip coupling network for electrically widening a tuning band of a dielectric resonator, said network including a varactor diode and a transmission line, wherein said transmission line is double or duplicated for creating a dipole structure and providing a tighter coupling with said dielectric resonator, and said dipole structure is about one-half wavelength long.

14. A microstrip coupling network for electrically widening a tuning band of a dielectric resonator, said network including a varactor diode and a transmission line, wherein said transmission line is double or duplicated for creating a dipole structure and providing a tighter coupling with said dielectric resonator, and said varactor diode is placed at a center of the dipole structure and is connected to its two branches through two further line lengths.

15. The microstrip coupling network of claim 14, wherein said two branches and said two further line lengths are, respectively, one-quarter and one-eighth wavelength long at a nominal operating frequency.

16. A method for widening the tuning band of a dielectric resonator through a microstrip coupling network, said network comprising a varactor diode and a transmission line, wherein the method comprises the steps of:

duplicating said transmission line for creating a dipole structure and providing a tighter coupling with said dielectric resonator; and biasing said varactor diode through suitable radiofrequency decoupling networks.

17. A microstrip coupling network, comprising:

a varactor diode having a first terminal coupled to a control voltage and a second terminal coupled to a ground;

a transmission line having a dipole structure, comprising, a first pole having a first branch coupled to said first terminal, and a second pole having a second branch coupled to said second terminal; and a dielectric resonator positioned between said first branch and said second branch.

18. The microstrip coupling network of claim 17, wherein said first branch is one of rectilinear and curvilinear and said second branch is one of rectilinear and curvilinear.

19. The microstrip coupling network of claim 17, further comprising:

a third branch coupled in series between said first branch and said first terminal; and a fourth branch coupled in series between said second branch and said second terminal.

20. The microstrip coupling network of claim 19, wherein said first branch and said second branch are each one-quarter wavelength long at a nominal operating frequency, and said third branch and said fourth branch are each one-eighth wavelength long at said nominal operating frequency.

21. The microstrip coupling network of claim 17, wherein at least one of said first branch and said second branch comprises at least one length that substantially follows the shape of said dielectric resonator.

22. The microstrip coupling network of claim 17, further comprising:

a first radiofrequency decoupling network coupled between said first terminal and said control voltage; and a second radiofrequency decoupling network coupled between said second terminal and said ground, wherein said first radiofrequency decoupling network and said second radiofrequency decoupling network provide biasing for said varactor diode.

* * * * *